United States Patent [19]

Skovmand

[11] Patent Number: 4,613,809
[45] Date of Patent: Sep. 23, 1986

[54] QUIESCENT CURRENT REDUCTION IN LOW DROPOUT VOLTAGE REGULATORS

[75] Inventor: Timothy J. Skovmand, San Jose, Calif.

[73] Assignee: National Semiconductor Corporation, Santa Clara, Calif.

[21] Appl. No.: 751,117

[22] Filed: Jul. 2, 1985

[51] Int. Cl.$^4$ ............................................... G05F 1/59
[52] U.S. Cl. .................................... 323/268; 307/315; 323/273; 323/280; 323/303; 357/46
[58] Field of Search .............. 323/269, 273, 279, 280, 323/281, 303, 268; 307/315; 357/46

[56] References Cited

U.S. PATENT DOCUMENTS 4,319,179 3/1982 Jett ...................................... 323/281
4,560,918 12/1985 Callen .................................. 323/273

FOREIGN PATENT DOCUMENTS 9722 1/1984 Japan .................................... 323/303
892426 12/1981 U.S.S.R. .............................. 323/268

Primary Examiner—William H. Beha, Jr.
Attorney, Agent, or Firm—Gail W. Woodward; Paul J. Winters

[57] ABSTRACT

An IC voltage regulator having a low dropout voltage is disclosed. A pass transistor driver is described in which the regulator quiescent current is reduced to a very small value.

4 Claims, 5 Drawing Figures

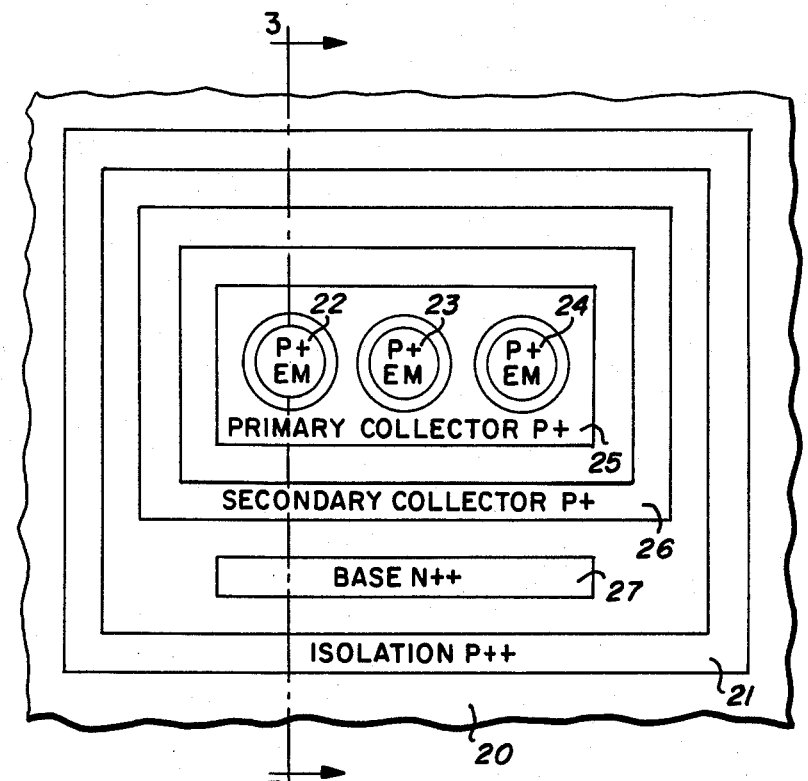
Fig_2
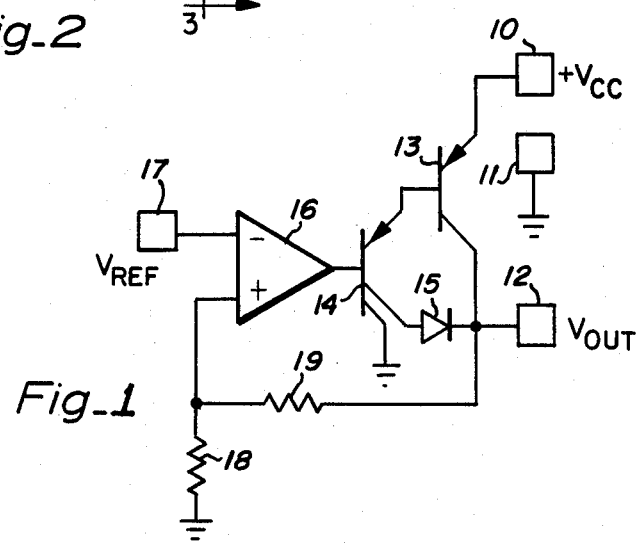
Fig_1
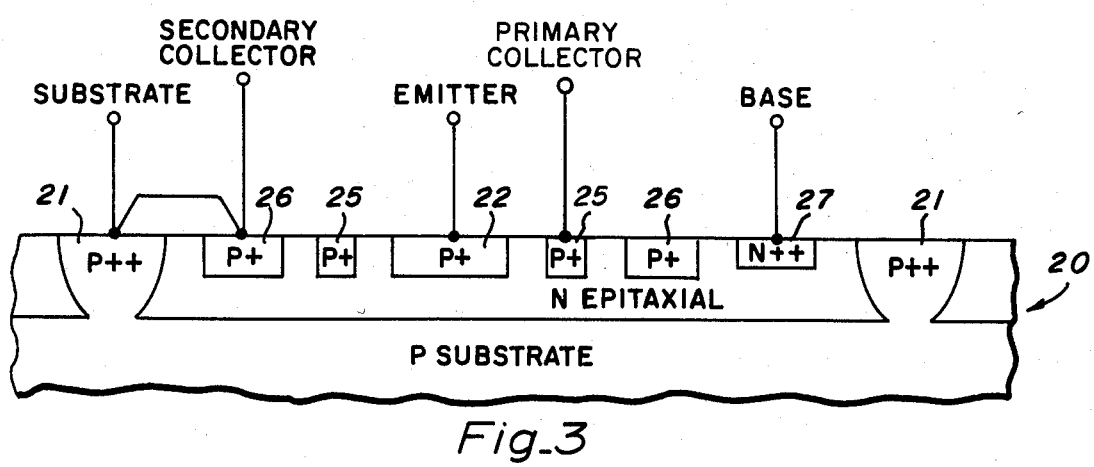
Fig_3

QUIESCENT CURRENT REDUCTION IN LOW DROPOUT VOLTAGE REGULATORS

BACKGROUND OF THE INVENTION

Voltage regulator dropout voltage is defined as the input-output voltage differential at which the circuit ceases to regulate against further reduction in input voltage. Quiescent current is defined as that part of the positive input current that does not contribute to the positive load current or it can be defined as the regulator ground lead current. The LM2931 series of voltage regulators are characterized as low dropout low quiescent current devices. The typical dropout voltage is 0.3 volt at 150 ma. The maximum quiescent current is listed at 15 ma which is 10% of rating. These devices are characterized in the National Semiconductor Corporation LINEAR DATABOOK © 1982. A higher current version, the LM2935 series, is characterized in the LINEAR SUPPLEMENT DATABOOK © 1984. This device has a 750 ma rating with a typical dropout of 0.82 volt at rated current. Its quiescent current maximum is 120 ma.

Low dropout voltage is important in battery powered voltage regulator applications where it is desirable, from a battery life standpoint, to provide the rated output at the lowest possible battery voltage. Since the quiescent current does not contribute useful output, the importance of keeping it low is self evident. One thing that most low dropout IC voltage regulators have in common is a PNP pass transistor. One such device is discussed in U.S. Pat. No. 4,417,265 which issued Nov. 22, 1983, to Judd R. Murkland and James S. Congdon and is assigned to the assignee of the present invention. This patent discloses a plural-emitter base ballasted PNP lateral transistor and its teaching is incorporated herein by reference.

SUMMARY OF THE INVENTION

It is an object of the invention to provide a driver for a low dropout voltage regulator.

It is a further object of the invention to reduce the quiescent current in a low dropout voltage regulator.

These and other objects are achieved in the following manner. A PNP lateral pass transistor is driven from a dual collector PNP which in turn is driven from a diff amp having one input at $V_{REF}$ and the other input operated from a voltage divider connected to the regulator output. The output voltage will be determined by $V_{REF}$ and the voltage divider ratio. The circuit will modulate the conduction of the pass transistor by way of the PNP driver until the diff amp inputs are forced to be equal.

The PNP driver has its primary collector coupled to the output of the regulator by way of a diode. The driver also has a secondary collector for collecting its emitter current when the primary collector saturates. The secondary driver collector is returned to the power supply ground terminal. When the driver primary collector is not saturated the secondary collector draws very little current so that regulator quiescent current is very low. In this mode the driver operates with the pass transistor very much like a Darlington circuit. When the pass transistor approaches dropout conditions the driver primary collector will saturate and the secondary collector will conduct the base current of the pass transistor thus lowering its saturation voltage to a very low value to provide low dropout.

The driver transistor can be fabricated as a conventional lateral transistor where the secondary collector is the substrate in a conventional PN junction isolated monolithic IC. Alternatively the secondary collector can be a ring collector surrounding the conventional lateral primary collector. When the primary collector is operating normally practically zero current will flow in the secondary collector. However when the primary collector saturates, the emitter current will flow to either the substrate or the secondary collector which is connected to the substrate. In another alternate embodiment of the invention a conductive buried layer is incorporated into the IC under the emitter. Thus, the carriers emitted toward the substrate will be reflected and the primary collector will be very efficient so that very few carriers are collected by the substrate. When the primary collector saturates it will reemit the carriers to the substrate that is exposed around the periphery of the buried layer. This means that when the primary collector saturates the substrate will become an efficient collector.

BRIEF DESCRIPTION OF THE DRAWING

FIG. 1 is a schematic diagram of the voltage regulator of the invention.

FIG. 2 is a topographic showing of a portion of an IC chip containing the driver transistor of FIG. 1.

FIG. 3 is a cross-section of the structure of FIG. 2 taken at line 3.

In FIGS. 2 through 4 the IC metallization along with the planar oxide and passivation films have been removed for clarity. FIGS. 3 and 5 are not to scale but are exaggerated vertically for clarity.

DESCRIPTION OF THE INVENTION

Figure 4:
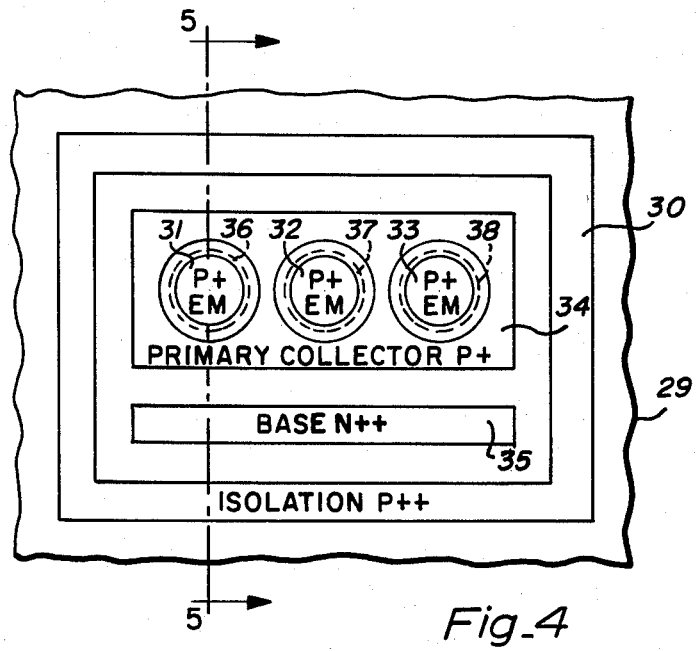
FIG. 4 is a topographic showing of a portion of an IC chip containing an alternative embodiment of the driver transistor of FIG. 1.

FIG. 1 is a schematic diagram of the voltage regulator of the invention. An input $V_{cc}$ power supply is connected + to terminal 10 and − to ground terminal 11. Since it is proposed to fabricate the circuit using conventional PNP junction isolated monolithic silicon technology, the IC p type substrate is connected to ground terminal 11. The regulated output appears at terminal 12. The output current is supplied by PNP pass transistor 13 which can be constructed as disclosed in U.S. Pat. No. 4,417,265. Where such a plural emitter PNP transistor is employed, the number of emitters employed, and hence the effective emitter area, is determined by the desired current rating. A 0.5 mil diameter emitter can supply about 3 ma at a reasonably high Beta.

Pass transistor 13 is driven by a dual collector PNP lateral driver transistor 14. The primary collector is coupled by way of diode 15 to the collector of pass transistor 13. The secondary collector is returned to ground as shown. Driver transistor 14 is constructed, as will be shown in detail hereinafter, so that under normal conditions the primary collector will receive virtually all of the emitter current. Thus under normal conditions, where pass transistor 13 is not operated close to drop out, diode 15 will conduct and very little current flows to ground in transistor 14 as quiescent current.

Transistor 14 is in turn driven by diff amp 16 which has its inverting input coupled to a $V_{REF}$ terminal 17. Resistors 18 and 19 form a voltage divider coupled from output terminal 12 to the noninverting input of diff amp 16. The resulting high gain amplifier loop will drive pass transistor 13 to adjust the voltage at terminal 12 to where the differential input voltage to diff amp 16 is close to zero. Thus the output or regulated voltage will be determined by the value of $V_{REF}$ and the voltage divider (resistors 18 and 19). For example, if resistors 18 and 19 provide a 20:1 voltage stepdown, a $V_{REF}$ of 1.25 would produce a regulated output of 25 volts.

In normal operation, as pointed out above, diode 15 conducts and driver transistor 14 acts with pass transistor 13 in a Darlington configuration. This configuration is very economical in terms of quiescent current. However such a connection has an unacceptably high saturation voltage. This produces an excessive dropout voltage. In the circuit of FIG. 1, as $V_{cc}$ approaches $V_{OUT}$, and the drop across terminals 10–12 approaches less than about 1.5 volts, conduction in diode 15 will fall off and the primary collector in transistor 14 will saturate. This action will transfer the emitter current in transistor 14 to the secondary collector and therefore convert the circuit from a Darlington to a common collector driver. This kind of driver can easily force pass transistor into saturation where the voltage drop can be a small fraction of a volt. Thus a dropout voltage well below a volt can be achieved.

Driver transistor 14 can be achieved in more than one way. FIG. 2 shows the IC topography for achieving one version. FIG. 3 is a cross section of the FIG. 2 stucture taken at line 3—3. In FIG. 2 and subsequent figures, the conventional IC metallization, along with any planar oxide and passivating layers, are removed for clarity. It is to be understood that such layers, as are conventionally employed in IC construction, will be employed in the usual manner.

Fragment 20 represents that portion of an IC chip that contains transistor 14. Ring 21 represents the conventional IC isolation diffusion. Circular regions 22–24 represent P+ type emitter diffusions that extend into an N type epitaxial layer grown on a P type substrate. These will serve as the emitter of transistor 14 and will normally be connected in parallel by metallization not shown. Only three such diffusions are shown, but it is to be understood that any desired number could be employed. The number would be determined by the overall current required in the transistor. Diffusion 25 is a P+ region that also extends into the epitaxial N type material to form a collector. This diffusion has holes therein so that it acts to surround each individual emitter element. Diffusion 26 is another P+ ring contoured to surround collector 25 and extend into the N type epitaxial material. Diffusion 27 is strongly or N++ doped region to serve as a base contact to the N epitaxial material. These various elements are shown in the cross-section of FIG. 3 which is a section taken through emitter 22. Since the conventional IC metallization has been removed in FIGS. 2 and 3, it is shown schematically in FIG. 3 and labeled to show function.

Figure 5:
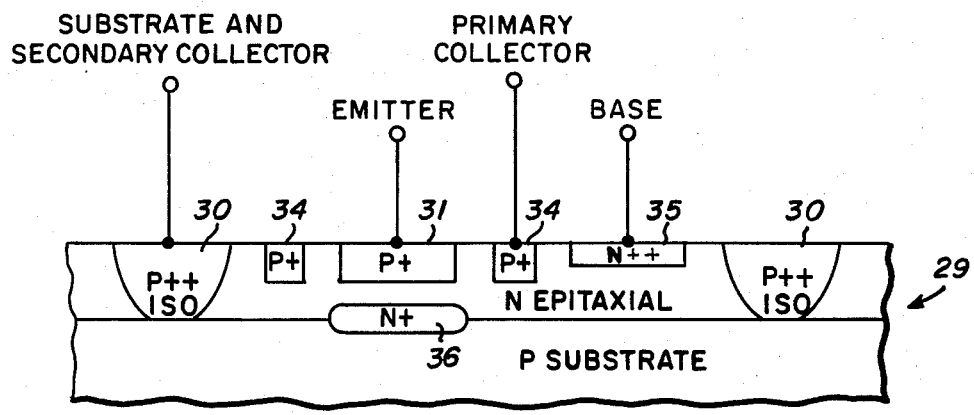
FIG. 5 is a cross-section of the structure of FIG. 4 taken at line 5.

FIG. 4 is a chip fragment 29 showing an alternative embodiment for transistor 14. Region 30 is a P++ isolation diffusion ring that extends completely through the epitaxial layer to provide an isolated N type tub. Again three P+ emitters are shown at 31–33 and a surrounding primary P+ collector 34 and they extend into the N type epitaxial material. An N++ base contact 35 provides an ohmic connection to the epitaxial material. The dashed outline 36 is a buried layer composed of an N+ insert located at the epitaxial layer-substrate interface. This layer is in the form of N+ regions located in registry with emitters 31-33. The showing in FIG. 5 details the cross section of fragment 29 taken at line 5—5. Buried layer 36 underlies emitter 31. In normal operation emitter 31, when forward biased, injects minority carriers into the N type base and they are collected by primary collector 34. Any minority carriers injected vertically toward the P type substrate will be reflected back toward primary collector 34 which will therefore efficiently collect them. This means that buried layer 36 makes the lateral transistor action vary efficient so that normal quiescent current is very low. However, when collector 34 saturates the injected carriers will be re-emitted by the primary collector and will be collected by the P type substrate around the periphery of buried layer 36. Thus, the substrate is the secondary collector which is contacted by way of isolation diffusion 30 and it will operate efficiently as a collector when primary collector 34 saturates. As was the case with FIG. 3, the various elements in FIG. 5 are shown with schematic labeled connections.

EXAMPLE

The structure shown in FIGS. 1, 2 and 3 was constructed using conventional monolithic junction isolated IC design. The pass transistor 13 was of lateral construction and employed 350 emitters for a regulator current rating of 1050 ma. Driver transistor 14 employed 52 emitters. The dropout voltage was 500 mv for the rated current. The quiescent current was only 50 ma at rating.

The invention has been described and a working example given. When a person skilled in the art reads the foregoing description, alternatives and equivalents, within the spirit and intent of the invention, will be apparent. Accordingly, it is intended that the scope of the invention be limited only by the following claims.

What is claimed:

1. An integrated voltage regulator circuit having positive and negative supply rails connectable to a source of operating power, said circuit having a low dropout voltage, a low quiescent current and comprising:
   a PNP pass transistor having an emitter coupled to said positive supply rail a collector providing the regulated output voltage and a base;
   a PNP control transistor having a base, an emitter coupled to said base of said pass transistor, a lateral primary collector coupled through a normally forward biased diode to said collector of said pass transistor and a secondary collector normally subservient to said lateral primary collector and capable of collecting injected current carriers when said lateral primary collector saturates;
   a diff amp having an output coupled to said base of said control transistor, a noninverting input coupled to a reference potential and an inverting input; and
   voltage divider means coupled between said collector of said pass transistor and said diff amp inverting input.

2. The circuit of claim 1 wherein said control transistor comprises a plurality of individual emitters and a primary lateral collector electrode surrounding each of said emitters wherein said integrated circuit substrate provides the desired secondary transisistor carrier collection when said primary lateral collector saturates.

3. The integrated circuit of claim 2 wherein said control transistor primary lateral collector is surrounded by a secondary lateral collector that is connected to said circuit substrate.

4. The integrated circuit of claim 2 wherein said control transistor has buried conductive inserts underlying said emitters wherein said buried conductive inserts suppresses substrate collection in the region directly under the emitters and permits peripheral substrate collection when said primary collector saturates.

* * * * *

UNITED STATES PATENT AND TRADEMARK OFFICE
CERTIFICATE OF CORRECTION

PATENT NO. : 4,613,809
DATED : SEPTEMBER 23, 1986
INVENTOR(S) : TIMOTHY J. SKOVMAND

It is certified that error appears in the above-indentified patent and that said Letters Patent is hereby corrected as shown below:

In Col. 4, line 46, after "rail" insert --,--.

In Col. 4, line 57, delete "a noninverting" and replace with --an inverting--.

In Col. 4, line 58, delete "an inverting" and replace with --a non-inverting--.

In Col. 4, line 61, delete "inverting" and replace with --non-inverting--.

Signed and Sealed this

Twenty-first Day of June, 1994

Attest:

BRUCE LEHMAN

Attesting Officer     Commissioner of Patents and Trademarks